United States Patent [19]

Picquendar

[11] Patent Number: 4,804,962
[45] Date of Patent: Feb. 14, 1989

[54] CLUTTER ELIMINATION RADAR

[75] Inventor: Jean-Edgar Picquendar, Whitman, Mass.

[73] Assignee: Diamond Devices, Inc., Wareham, Mass.

[21] Appl. No.: 520,205

[22] Filed: Aug. 4, 1983

[51] Int. Cl.$^4$ ............................. G01S 7/28; H03H 7/12
[52] U.S. Cl. ..................................... 342/159; 342/203; 455/311; 328/167
[58] Field of Search .................. 343/7.7, 17.1 R, 7 A, 343/17.2 R; 367/97; 333/167, 172, 174, 175, 176; 342/159, 175, 203; 455/307, 311; 328/165, 167

[56] References Cited

U.S. PATENT DOCUMENTS

| | | | |
|---|---|---|---|
| 2,196,881 | 4/1940 | Wheeler | 333/174 |
| 2,878,379 | 3/1959 | Parker et al. | 342/159 X |
| 3,389,349 | 6/1968 | Troost et al. | 333/172 |
| 3,585,538 | 6/1971 | Lindsey | 333/176 |
| 3,744,015 | 7/1973 | Marimon et al. | 343/7 PL |
| 4,290,066 | 9/1981 | Butler | 343/17.1 R |
| 4,453,145 | 6/1984 | Schuster | 333/176 |

FOREIGN PATENT DOCUMENTS 1211698  3/1966  Fed. Rep. of Germany ...... 342/203

OTHER PUBLICATIONS

J. L. Lawson, G. E. Uhlenbach, "Threshold Signals", Radiation Lab Series, 1950, pp. 297–302.
H. Urkowitz, "Filters for Detection of Small Radar Signals in Clutter", Journal of Applied Physics, vol. 24, #8, 8/53, pp. 1024–1031.
A. W. Rihaczek, "Target Detection in Clutter", Principals of High-Resolution Radar, 1969, pp. 350–365.

Primary Examiner—Thomas H. Tarcza
Assistant Examiner—Gilberto Barrón, Jr
Attorney, Agent, or Firm—Wolf, Greenfield & Sacks

[57] ABSTRACT

A radar receiver having a clutter-elimination filter in the receiver's intermediate frequency stage. The filter is centered on the intermediate frequency $f_i$ and has a transfer function in which a band-pass characteristic is superimposed on a band-rejection characteristic. The band-pass response has a principal lobe substantially conforming to the function $(\sin x)/x$ with $x=(w-w_i)\pi T$. The band-rejection response presents an attenuation zone centered about $f_i$; this zone is wide enough to suppress much of the response from clutter but narrow enough to avoid suppressing much of the energy in the echo from the target. For example, the width of the attenuation zone may be from about $f_i-0.2/T$ to about $f_i+0.2/T$. The filter provides a maximum response on each side of the attenuation zone, spaced from $f_i$ by about 0.4/T Hz in each direction. Outside the maxima, the response is dominated by the band-pass characteristic and achieves transmission minima at about 1/T Hz above and below $f_i$. Examples are given of filters providing such transfer functions.

8 Claims, 5 Drawing Sheets

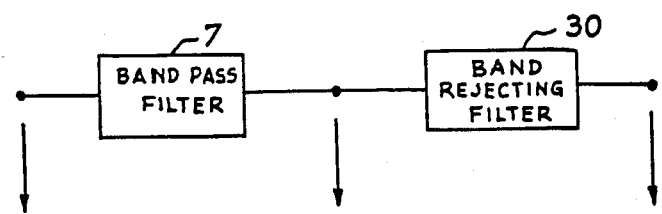
Fig. 3A
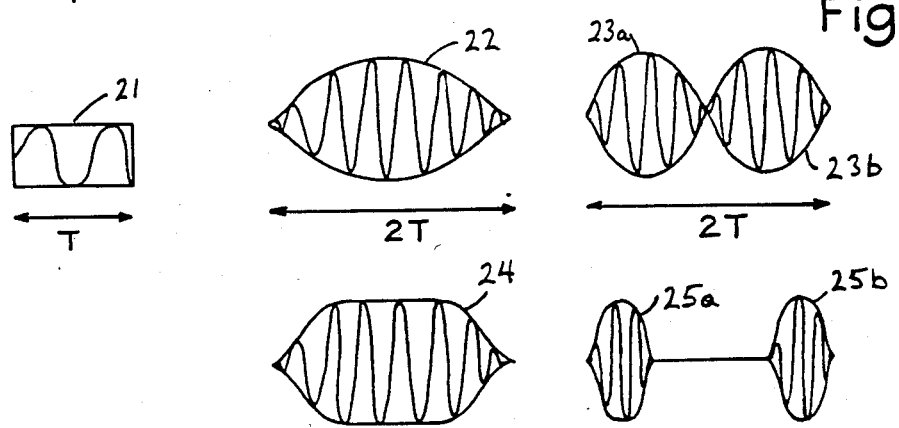
Fig. 3B
Fig. 3C
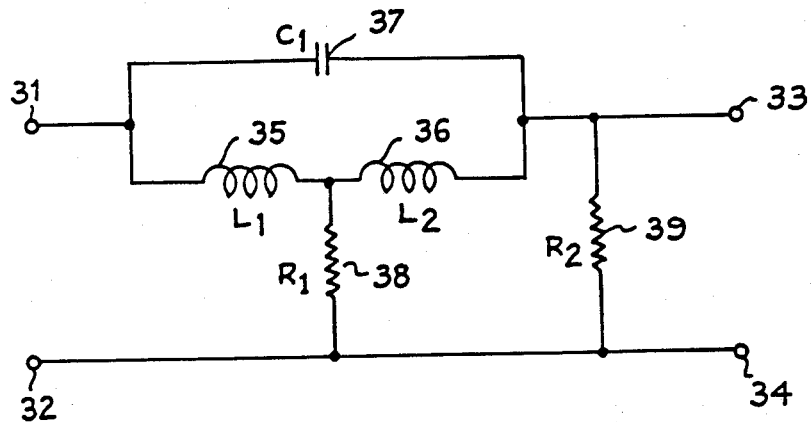
Fig. 4

CLUTTER ELIMINATION RADAR

BACKGROUND OF THE INVENTION

1. Field of the Invention

The invention relates to a radar provided with a clutter elimination device or system. The "clutter" referred to herein is noise caused on a radar display by the presence of a profusion of echoes from fixed targets such as sea waves, atmospheric conditions, some ground configurations, bird or insect flights, or chaff.

2. Description of the Prior Art

To better understand the invention, consider first the general configuration of a radar system as shown in FIG. 1A. Schematically, a radar system comprises an oscillator which provides a signal at a frequency f in the range of some GHz. This signal is amplified by an amplifier 2 which emits signal bursts (such as the bursts 9a and 9b in FIG. 1B), each of which comprises several cycles of energy at the high frequency f, for a short pulse duration T of, for example, about 500 nanoseconds. This signal is transmitted toward a target by an antenna 3; that same antenna 3 or another neighboring antenna 4 receives a returning echo from the target. This echo is transmitted from the receiving antenna to the first input of a mixer 5. The second input of the mixer 5 receives the output of a stable or stabilized oscillator 6 providing a carrier at a frequency $f+f_i$. The frequency $f_i$ is called the "intermediate frequency" and is typically in the range of some tens or hundreds of MHz. In the following examples, the intermediate frequency $f_i$ is 30 MHz, but of course this does not constitute a limitation of the invention. At the output of the mixer 5 there appears a signal resulting from the interaction between the echo and the local oscillator signal at frequency $f+f_i$. If there is no Doppler effect shifting the frequency of the echo, this output signal is at a frequency equal to $f_i$. The signal at the output of the mixer 5 is transmitted to a filter 7 and thence to a decoder and display system 8. FIG. 1C shows very schematically the signal 11 at the output of the mixer 5; this signal has substantially the same envelope as that of signal 9 emitted by the radar transmitter—a train of pulses of duration T—but the frequency of the carrier within the pulse envelope is much lower than that of the oscillator 1, being close to the frequency $f_i$.

The main purpose of the filter 7 is to transmit the returning pulse while eliminating as far as possible the white noise outside the radar pulse spectrum. It is known that, in order to obtain such a result, the filter must have a transfer function of the type (sin x)/x with $x=(w-w_i)\pi T$. This (sin x)/x comprises, as is well known, a principal lobe surrounded with a great number of lateral lobes having a lesser amplitude. Therefore, the filter 7 as used in practice generally has a response curve or transfer function the shape of which is as close as possible to the shape of the principal lobe of a (sin x)/x function. A typical filter response curve is shown at 12 in FIG. 2. As a numerical example, if the intermediate frequency is equal to 30 MHz and the pulse-time duration is equal to 500 nanoseconds, this filter will have transmission maxima at 30 MHz and transmission minima at 28 and 32 MHz. Generally, it has been accepted that such a filter characteristic, which permits a good elimination of white noise, also permits a satisfactory suppression of clutter noise. When clutter noise is too high, the usual attempt to eliminate or suppress it is made not at the level of this filter (i.e., not on a pulse-by-pulse basis), but, rather, at the level of the decoder and display system; to that end, pulses are stored as they are received and comparisons are made between the information content of successive radar echoes. These classical clutter elimination devices, however, usually are complex and not very efficient.

SUMMARY OF THE INVENTION

Therefore, it is an object of the present invention to provide an improved clutter elimination device.

Another object of the invention is to provide a clutter noise elimination device which reduces clutter noise by filtering at the intermediate frequency stage.

A still further object of the invention is to provide an improved band rejection filter which is useful for clutter elimination and is adjustable in a particularly simple way.

The foregoing and other objects are achieved with the present invention which comprises a filter in the intermediate frequency stage of the radar receiver. This filter is centered on the intermediate frequency $f_i$ and has a transfer function which combines a band-pass characteristic with a band-rejection characteristic. More precisely, the filter response is that of a band-pass filter having a principal lobe substantially conforming to the function (sin x)/x with $x=(w-w_i)\pi T$, except at its center (i.e., the intermediate frequency $f_i$), where it presents an attenuation zone centered about $f_i$. The attenuation zone is wide enough to suppress much of the response from clutter without suppressing much of the energy in the echo from the target; for example, the width of the attenuation zone may be from about 0.8/T to about 1.2/T.

In other words, the invention provides a clutter eliminating filter for a radar system which emits pulses of duration T, wherein the filter is employed near the input of the receiving circuitry, in the intermediate frequency stage. The filter is centered on the intermediate frequency $f_i$ and presents a transmission minimum in a relatively broad band localized around this frequency $f_i$, with a maximum situated on each side of the minimum and being spaced from the minimum by about 0.4/T Hz in each direction. Additionally, transmission minima are situated on both sides of those local maxima and at a distance from the central minimum in the range of 1/T Hz. To avoid attenuating the whole radar pulse while obtaining an optimum elimination of the clutter, the attenuation of the minimum at $f_i$ may be adjusted with respect to the neighboring maxima.

The filter of the present invention can be implemented in two parts: (1) a first, classical band-pass filter as used in the prior art and having a transfer function approximating the principal lobe of the function (sin x)/x, with $x=(w-w_i)\pi T$; and (2) a second, stop-band filter presenting a substantially flat response except in a rejection band centered on the intermediate frequency $f_i$ and having a width substantially half that of the principal lobe of the function (sin x)/x.

In view of the frequency range of the intermediate frequency $f_i$—i.e., some tens of MHz—the invention can be implemented using surface acoustic wave filters. Alternatively, the invention may be implemented using discrete components or in any other fashion suitable for manufacture.

The foregoing and other object, features, and advantages of the present invention will be disclosed in greater detail and made more apparent by the detailed description contained below. This detailed description is exemplary only; the invention is defined by the claims appended at the end hereof. The detailed description should be read in conjunction with the attached drawing.

BRIEF DESCRIPTION OF THE DRAWING

In the drawing,

FIG. 3A shows a block diagram for implementing a filter according to the present invention, by using two elementary filters;

FIGS. 3B and 3C are illustrations of waveforms at different points in the filter of FIG. 3A;

FIG. 4 is a schematic circuit diagram showing an embodiment of a filter in accordance with the present invention, constructed from discrete components;

DESCRIPTION OF THE PREFERRED EMBODIMENTS

Figure 1A:
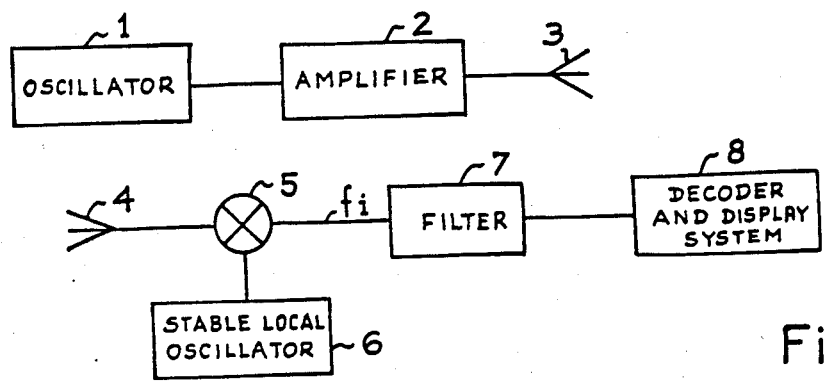
FIGS. 1A-1C show, respectively, a block diagram for a conventional radar transmitter and receiver; a diagrammatic illustration of an idealized radar pulse train emitted by the radar transmitter of FIG. 1A; and an idealized reflected pulse train received by the radar receiver of FIG. 1A.
Figure 1B:
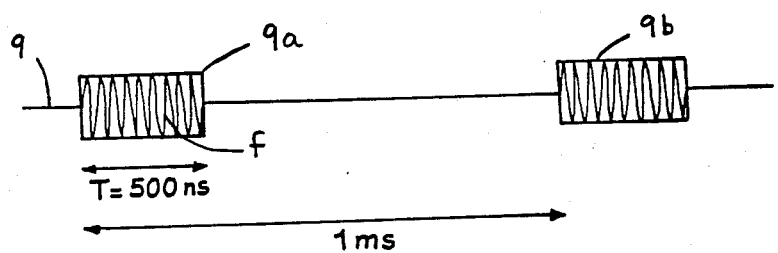
Figure 1C:
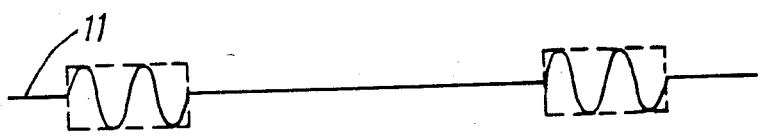
Figure 2:
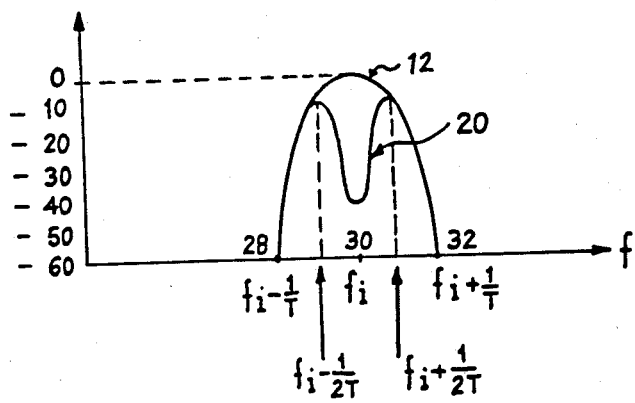
FIG. 2 is a diagrammatic illustration of a frequency response curve of a classical prior art radar receiver intermediate frequency filter superimposed on the frequency response curve of a filter constructed in accordance with the present invention.

As indicated above, curve 12 of FIG. 2 shows the transfer function of a filter of the type usually employed in the intermediate frequency stage of a radar receiver. This filter permits the transmission of the greatest part of the frequency spectrum of the radar echo. According to the invention, when there is clutter the intermediate frequency filter is modified in order to obtain a transfer function of the type shown by curve 20 in FIG. 2. This modified transfer function presents a minimum at the intermediate frequency $f_i$. The inventor's analysis indicates that the greatest part of the parasitic frequency response component introduced by clutter is very close to the frequency f of the radar pulse. The inventor has made experiments on a radar provided with such a filter, and he has noted that, by suitably adjusting the attenuation of the transmission minimum at the frequency $f_i$, it was possible to obtain an improvement of the signal-to-(clutter) noise ratio of 20 dB or more—that is, an improvement of this signal/noise ratio by a factor of 100. Therefore, the invention may make visible to the radar operator an echo which otherwise would have disappeared in the clutter.

To implement a filter according to the invention, while modifying as little as possible the classical signal processing chain in a radar receiver, the invention adds to the classical band-pass filter 7 an additional band rejection filter or stop-band filter 30. A first effect of such a modification is shown in FIGS. 3B and 3C. At the input of the band-pass filter 7, the radar echo pulse 21 substantially corresponds to an intermediate frequency signal with an envelope of the shape of a rectangular window and a time duration T. After the filtering by the band-pass filter 7, the pulse has a time duration 2T and substantially the envelope shown at 22. After additional filtering by the stop-band filter 30, one obtains successively two pulses 23a and 23b inside the time duration 2T; that is, on the radar display, one finds two successive radial images for each echo. This facilitates the identification of a useful echo with respect to the noise, because every useful echo becomes a double echo. If the band-pass filter 7 is mismatched and presents too strong an attenuation, the waveform envelope will appear as at 24 at the output of the band-pass filter; then, at the output of the stop-band filter 30, two successive radial echoes 25a and 25b are obtained, with these two echoes simply being more spaced from each other than are the echoes 23a and 23b. This phenomenon is not a drawback but, to the contrary, can be used to obtain better target detection.

A first aspect of the invention lies, as explained above, in the teaching of the particular response curve which is useful as an intermediate frequency filter for eliminating clutter noise. However, it is not easy to implement a stop-band filter 30 having the desired response curve. Classical stop-band filters do not provide such narrow rejection bands. Recalling the values indicated above, the band-pass filter has a maximum (i.e., a pole) for a frequency of 30 MHz and minima (i.e., zeroes) for frequencies of 28 and 32 MHz. Therefore, the additional stop-band filter must have a zero at a frequency of 30 MHz and poles extremely close to this zero (i.e., at a distance of less than 1 MHz away) in order to provide a sufficiently narrow rejection band. Accordingly, another aspect of the invention is a new filter design providing this result and capable of implementation with discrete elements in accordance with classical radar technology.

Figure 5:
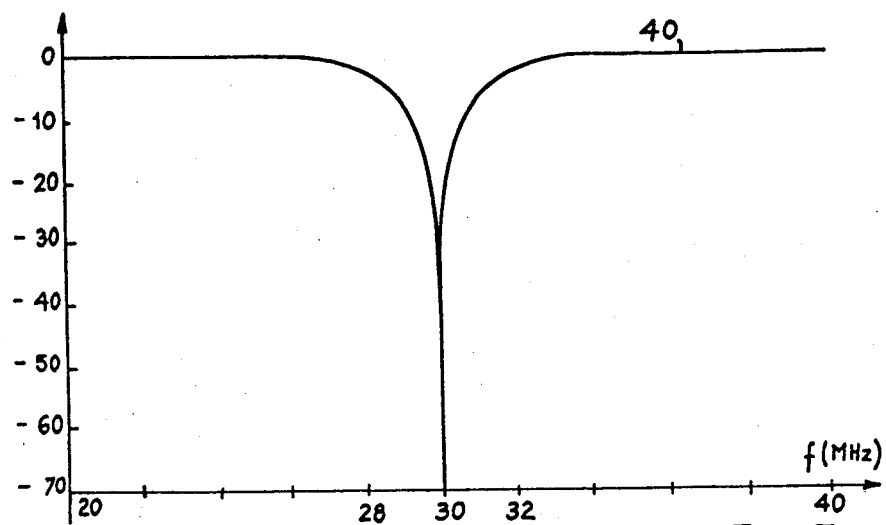
FIGS. 5 and 6 are frequency response curves for filters according to the present invention.

An embodiment of such a filter is shown in FIG. 4. This filter 30 comprises input terminals 31 and 32 and output terminals 33 and 34, the input terminal 34 and output terminal 32 being common. Between the input terminal 31 and output terminal 33 a pair of inductors 35 and 36 are connected in series. These inductors are paralleled by a capacitor 37. The junction of the inductors 35 and 36 is connected through a resistor 38 to input terminal 32 and output terminal 34. A second resistor 39 is connected between the output terminals 33 and 34. Calculation shows that such a filter presents a pole and a zero at substantially the same frequency. Therefore, the rejection band of this filter will be extremely narrow. The central frequency of this filter is determined by the relative value of the inductors 35 and 36 and the capacitor 37. The response curve, or transfer function, 40 of the filter of FIG. 4 is shown in FIG. 5, assuming the following numerical component values:

R1 (value of resistor 38)=5000 ohms
R2 (value of resistor 39)=5000 ohms
L1 (value of inductor 35)=1 uh.

L2 (value of inductor 36)=1 uh.

C1 (value of capacitor 37)=12.6 uf.

For this filter, the zero is at a frequency of 30 MHz and the pole is substantially at the same frequency (i.e., 30,007 MHz). The value of resistor 38 (i.e., 5,000 ohms is chosen equal to one quarter of the equivalent parallel resistor of the resonant circuit (capacitor 37 and inductors 35 and 36) which, in a practical case, is in the range of 20,000 ohms.

Figure 6:
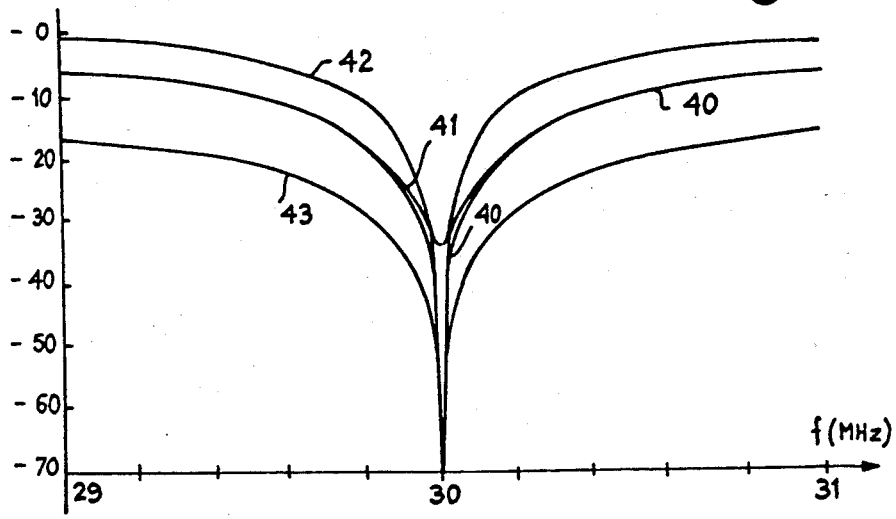

FIG. 6 again shows the curve 40 of FIG. 5, but at a broadened frequency scale; that is, on the abscissa the frequency ranges from 29 to 31 MHz instead of from 20 to 40 MHz as in FIG. 5. At the frequencies of 29 and 31 MHz, the filter attenuation is lower than 10 dB, but this attenuation is about 70 dB for the center frequency of 30 MHz. FIG. 6 also shows other response curves corresponding to different values of the resistors 38 and 39. The curve 40 corresponds to the case where both resistors are 5,000 ohms, the value of resistor 38 being optimized as a function of losses in the reactive elements 35, 36, and 37. As shown by curve 41, when resistor 38 is modified, the attenuation of the filter is at the minimum. Curve 41 corresponds to the case where resistor 39 equals 5,000 ohms and resistor 38 equals 4,500 or 5,500 ohms. In the case of curves 42 and 43, the value of resistor 38 is always equal to 5,000 ohms, but the resistor 39 is chosen equal to 50,000 ohms for curve 42 and to 1,000 ohms for curve 43. Thus, the value of resistor 39 has an influence on the opening of the curve—that is, the curve becomes narrower as the value of resistor 39 increases.

An important advantage of the filter according to the invention appears from these curves: that is, the independence of the effects of the various parameters. Indeed, changes in the value of resistor 38 act only on the value of the attenuation at the minimum, while changes in the value of resistor 39 act only on the opening of the curve. Thus, it is particularly easy to set the parameters of the filter to obtain a desired response curve shape.

Figure 7:
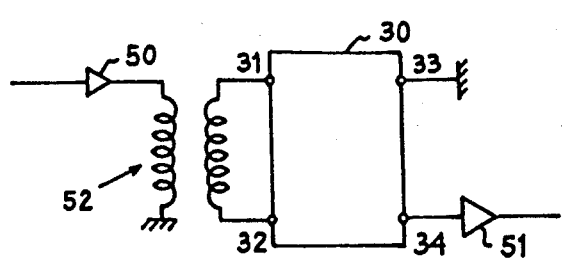
FIG. 7 is a partially schematic circuit, partially block diagram of a first alternative embodiment of a filter according to the present invention.

FIG. 7 shows an impedance matching circuit associated with the filter 30 according to the invention. The filter 30 comprises input terminals 31 and 32 and output terminals 33 and 34. To obtain a low impedance input, a low impedance amplifier 50 (e.g., an emitter follower) is connected to the input; and for obtaining a high impedance output, high impedance amplifier 51 (for example, of the MOS transistor type), is connected to the output. Additionally, a ferrite transformer 52 can be connected between the input terminals 31 and 32. Therefore, it is possible to chose a ground terminal in the filter circuit. This ground terminal preferably (but not necessarily) is chosen to be at the terminal of the resonant circuit formed by capacitor 37 and inductors 35 and 36 for providing a reduction of the parasitic capacitances. Transformer 52 also cancels the initial overvoltage of the impulse response associated with the presence of the capacitance 37.

Figure 8:
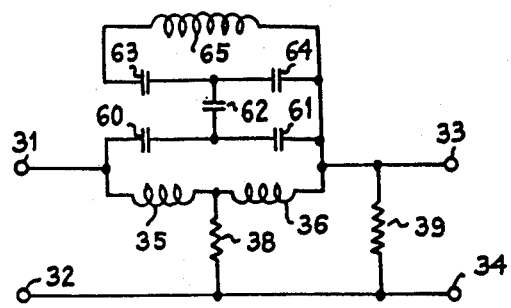
FIG. 8 is a schematic circuit diagram illustrating a second alternative embodiment of a filter according to the present invention.

FIG. 8 shows another embodiment of the filter according to the present invention, which embodiment permits a broadening of the attenuation zone through the use of coupled resonant circuits. One finds again in this figure the terminals 31–34, the inductors 35 and 36, and the resistors 38 and 39. The capacitor 37 has been replaced by two serially connected capacitors 60 and 61, the junction of which is connected through a capacitor 62 to the junction between two capacitors 63 and 64, the other terminals of which are connected through an inductor 65. The terminals of the capacitors 61 and 64 which are not connected through the capacitor 62 are connected directly to each other.

Figure 10:
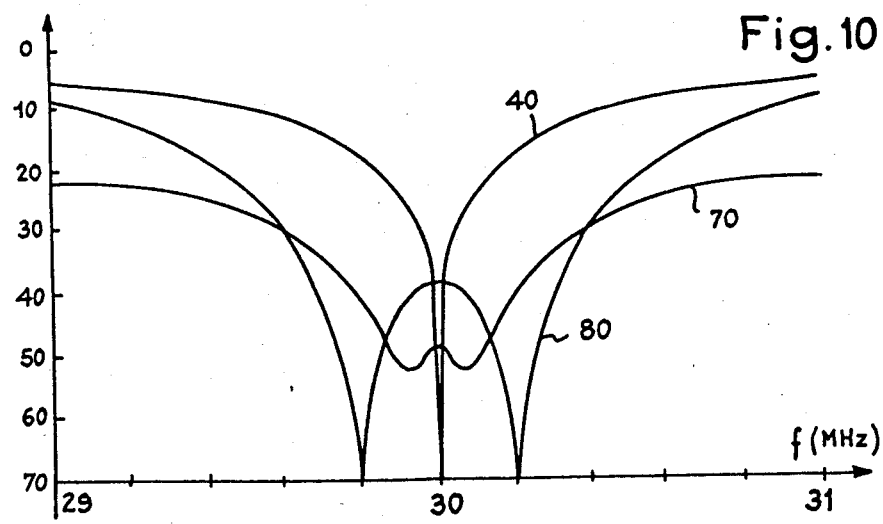

In FIG. 10, the curve 40 characterizing the filter 30 of FIG. 4 is again shown and, on the same figure, the response curve 70 of the filter 30' of FIG. 8 is shown. For FIG. 10, it is assumed the values of the component parameters are as follows:

R1=3013 ohms

R2=50 ohms

L1=L2=1 uh.

inductor 65=2 uh.

capacitor 60=14.26 uf.

capacitor 61=95.22 uf.

capacitor 62=17.85 uf.

capacitor 63=14.28 uf.

capacitor 64=95.22 uf.

With such component values, zeroes are introduced at the frequencies 29.9 and 30.1 MHz, to provide the transfer function of the shape shown.

Figure 9:
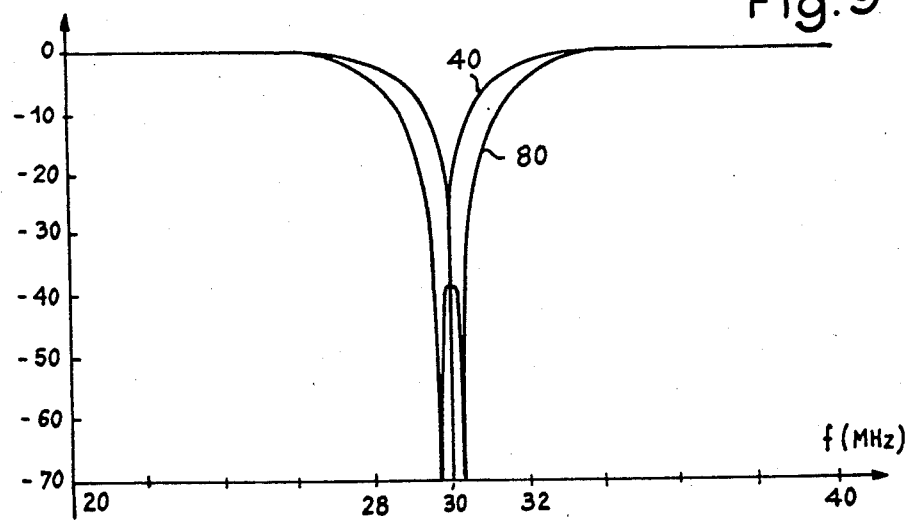
FIGS. 9 and 10 are response curves for filters for various embodiments of the present invention.

Another method for broadening the attenuation zone consists of connecting in series two filters in accordance with the present invention, the zeroes of the two filters being slightly offset from each other and impedance matching systems being provided between the filters (such as the impedance matching circuits of FIG. 7). Such a serial connection of two stop-band filters provides a response curve of the type shown at the reference 80 in FIG. 9, and in a broadened rejection band as shown in FIGS. 9 and 10. This serial connection of two filters is simpler to adjust than the coupled circuit of the type shown in FIG. 8. Therefore, it is possible to obtain a rejection filter whose notch width is very precisely adjustable.

Figure 11:
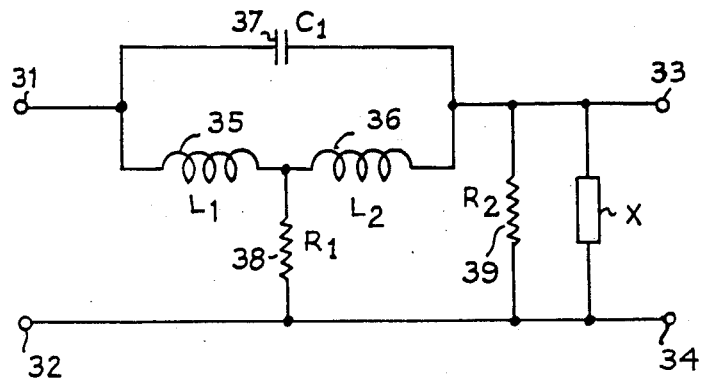
FIG. 11 is a schematic circuit diagram illustrating still another embodiment of the invention.
Figure 12:
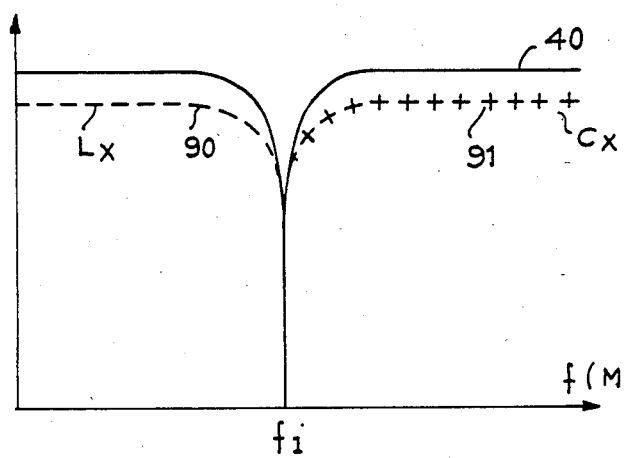
FIG. 12 is a schematic illustration portraying the shape of the response curve of a filter constructed in accordance with FIG. 11.

FIG. 11 shows another embodiment 30" of the filter according to the invention. In addition to the elements 31 to 39 already discussed in connection of FIG. 4, this filter comprises, between the output terminals 33 and 34 and in parallel with second resistor 39, a reactive element X which can be capacitive or inductive. Notationally, when the reactive element X is an inductor, it is identified as $L_X$ and when it is a capacitor $C_X$. The influence of this additional reactive component X on the transfer function or response curve of the filter is shown in FIG. 12. FIG. 12 again shows the curve 40 characterizing the elementary filter 30 of FIG. 4. However, when the reactive component X is inductive, instead of obtaining the symmetrical 40, one obtains an asymmetrical curve 90. The curve 90 is analogous to the curve 40 except at the left of the zero (on the side of the low frequencies) where the attenuation is higher than in the absence of the inductor. Conversely, in the case of a reactive impedance $C_X$, the curve 40 is modified at the right of the zero (on the side of the high frequencies) as indicated by reference 91.

Figure 13:
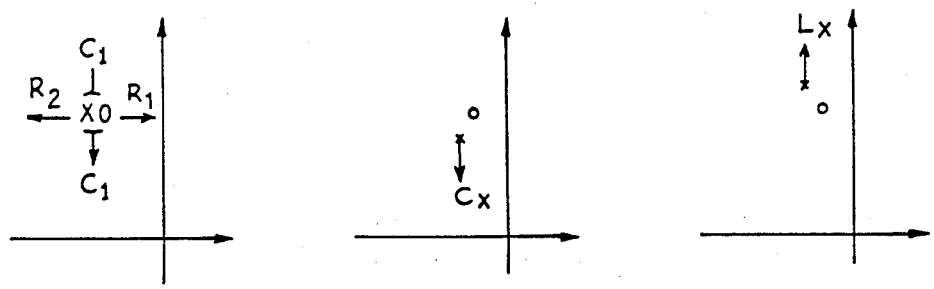
FIGS. 13A, 13B and 13C are pole-zero diagrams showing how the poles and zeros of the filter of FIG. 11 move when the filter parameters are varied.

FIG. 13A shows, in the complex plane, the main pole and zero of a filter having the response curve 40. In fact, this representation in the complex plane can be interpreted as showing along the ordinate the frequency of a pole or zero and along the abscissa the damping of this pole or zero. The filter shown by the curve 40 comprises a pole and a zero at the same frequency but with eventually distinct dampings according to the setting of resistors 38 and 39. The matching of the resonant circuit (that is, the setting of the capacitor 37) permits modification of the frequency of the pole and zero. Damping of the zero may be modified by changing the value of resistor 38; maximum attenuation corresponding to the zero is achieved when the value of the resistor 38 equals one quarter of the equivalent loss resistance of the resonant circuit. The value of resistor 39 may be changed to set the damping corresponding to the pole; the width of the negative peak (i.e., notch) of the frequency response is minimal when resistor 38 is very high. Adding a capacitive reactive impedance $C_X$ across the output of the filter reduces the frequency of the pole with respect to the frequency of the zero, which corresponds to the curve 91. Adding an inductive reactive impedance $L_X$ in parallel across the output terminals increases the pole frequency and provides the frequency response shown by curve 90. In the case of curves 90 and 91, if values of the parameters are chosen so that the attenuation notch is not important, filters are obtained which correspond to high-pass and low-pass filters relative to frequency $f_i$; use of the capacitive reactance $C_X$ yields the low-pass filter and use of the inductive reactance $L_X$ provides a high-pass filter.

Rather than serially cascading two filters of the type shown in FIG. 4, an advantage may be gained in some cases by cascading two filters of the type shown in FIG. 11, with one of them employing a capacitive reactance element $C_X$ and the other employing an inductive reactive element $L_X$ across its output. This approach facilitates the setting of the value of the attenuation peak at $f_i$.

The conventional filters used for approximating a (sin x)/x function are never ideal; if one seeks to obtain in the high part of the pass-band a response curve very close to the (sin x)/x function, one generally obtains a filter which is broader than a (sin x)/x filter should be (i.e., the sides of the curve are not steep enough). To avoid this condition, filters of the type shown in FIG. 11 may be cascaded, such filters having zeros at the frequencies where it is desired that the (sin x)/x function achieve a null (i.e., the frequencies corresponding to $f_i+1/T$ and $f_i-1/T$). Of course, when the filters are cascaded in this fashion, impedance matching must be provided between each pair of filters. Appropriate impedance matching devices have been illustrated schematically in FIG. 7.

The discrete filter embodiment of the present invention thus comprises a two-port device wherein: two first reactive impedances of a first type are disposed in parallel with a second reactive impedance of the other type, connected between a first input terminal and a first output terminal; a first resistor is connected between the junction of the first reactive impedances and the second input and output terminals; and the second resistor is connected between the two output terminals. The two available types of reactive impedances are an inductive reactive impedance and a capacitive reactive impedance. The reference to a "type" of reactive impedance refers to either the inductive type or the capacitive type of element.

To obtain a low input impedance for the filter, an emitter follower circuit preferably is connected to the input of the filter as a buffer; and for obtaining a high output impedance, a FET amplifier can be used.

With a discrete filter comprising the above elements, the reactive impedance of the second type can be adjustable for setting the center frequency of the filter. An adjustment of the first resistor permits modification of the attenuation at the central frequency and an adjustment of the second resistor permits modification of the bandwidth of the notch, or rejection zone, of the filter.

Particular discrete filters have been disclosed hereinabove in connection with their application to a clutter elimination radar system. Of course, such filters also are considered here as part of the invention in their own right, even for applications other than clutter elimination in radar systems. These filters are particularly advantageous because of the independence of the action of the various parameters on their response curves.

On the other hand, for application to a radar, particular discrete filters have been disclosed. The implementation of a response curve such as shown in FIG. 2 at reference 12 can be obtained by using surface acoustic wave filters. With such filters, a (sin x)/x function is very easy to obtain. For this purpose, transducers with combs of equidistant teeth are used, the pitch of the tooth spacing being calculated from the value of the center frequency $f_i$. Further, for the stop-band filters providing the transfer function of the type shown by curve 80 in FIG. 10, two transducers may be employed, facing each other through a coupler; the length of the teeth therein is chosen in an appropriate way known to those skilled in the art, and the pitch of each transducer respectively corresponds to one of the frequencies of the two transmission minima.

The invention, of course, is not limited to the above explicitly disclosed embodiments. On the contrary, it embraces the variations and generalizations thereof included in the scope of the appended claims.

What is claimed is:

1. A clutter elimination radar receiver for processing return echoes from high-frequency radar pulses emitted for time windows having a duration T, such receiver being of the type having an intermediate frequency stage, the receiver further comprising in the intermediate frequency stage, a filter centered on and providing a local response minimum at the intermediate frequency $f_i$, the filter also providing response maxima on both sides of this minimum at a separation therefrom of the same order of magnitude as 0.2/2T, and transmission minima on both side of those maxima and at a distance from $f_i$ of about 1/T Hz, the filter further comprising (a) a conventional band-pass filter, having a transfer function substantially conforming to the shape of the principal lobe of the function (sin x)/x, with $x=(w-w_i)\pi T$, and where $w=2\pi f$, and (b) and a stop-band filter presenting a substantially flat response except in a rejection band centered on $f_i$ and having a width approximately half that of said principal lobe, the stop-band filter comprising a first stop-band filter and a second stop-band filter, the output of the first stop-band filter being connected to the input of the second stop-band filter, each of said first and second stop-band filters presenting a substantially flat response except in a rejection band centered on a selected rejection frequency, said rejection frequencies being slightly offset from each other to produce a composite rejection band centered on $f_i$ and having a width approximately half that of said principal lobe.

2. A clutter elimination radar receiver for processing return echoes from high-frequency radar pulses emitted for time windows having a duration T, such receiver being of the type having an intermediate frequency stage, the receiver further comprising in the intermediate frequency stage, a filter centered on and providing a local response minimum at the intermediate frequency $f_i$, the filter also providing response maxima on both sides of this minimum at a separation therefrom of the same order of magnitude as 0.2/2T, and transmission minima on both sides of those maxima and at a distance from $f_i$ of about 1/T Hz, the filter further comprising (a) a conventional band-pass filter, having a transfer function substantially conforming to the shape of the principal lobe of the function (sin x)/x, with $x=(w-w_i)\pi T$, and where $w=2\pi f$, and (b) a stop-band filter presenting a substantially flat response except in a rejection ban centered on $f_i$ and having a width approximately half that of said principal lobe, the stop-band filter being associated with two low impedance input terminals and two high impedance output terminals and comprising (1) an assembly of two first reactive impedances of a first type, selected from a capacitive type of reactance and an inductive type of reactive, in series with each other and in parallel with a second reactive impedance of a second type, being an inductive reactance if the first type of reactance is a capacitive reactance and being a capacitive reactance if the first type of reactance is an inductive reactance, said assembly being connected being connected between one of the input terminals and one of the output terminals; (2) a first resistor connected on the one hand to the series junction of the first reactive impedances and on the other hand to the second input and output terminals; and (3) a second resistor connected between the output terminals.

3. The radar receiver of claim 2 wherein the value of the reactive impedance of the second type is selected to set the center of the rejection band.

4. The radar receiver of claim 2 wherein the value of the first resistor is selected to set the attenuation of the rejection band.

5. The radar receiver of claim 2 wherein the value of the second resistor is selected to set the width of the rejection band.

6. The radar receiver of claim 2, wherein the reactive impedance of the second type comprises a series combination of first and second capacitors, and further wherein the junction of those capacitors is connected to a first lead of the third capacitor; fourth and fifth capacitors connected in series with each other; the second lead of the third capacitor being connected to the series junction of the fourth and fifth capacitors; an inductor in parallel with the series combination of the fourth and fifth capacitors; and the leads of the second and fifth capacitors distal the third capacitor being connected to the first output terminal.

7. The radar receiver of claim 2 further comprising a reactive impedance in parallel with the second resistor.

8. The radar receiver of claim 2 wherein the input terminals of the filter are connected to the secondary winding of a ferrite transformer.

* * * * *